United States Patent
Li et al.

(10) Patent No.: US 10,314,138 B2
(45) Date of Patent: Jun. 4, 2019

(54) LAMP CONTROL UNIT, LIGHTING DEVICE AND LIGHTING SYSTEM

(71) Applicant: TRIDONIC GMBH & CO KG, Dornbirn (AT)

(72) Inventors: Ronnie Li, Shenzen (CN); Markus Kuenzli, Glarus (CH); Tjaco Middel, Shenzhen (CN)

(73) Assignee: TRIDONIC GMBH & CO KG, Dornbirn (AT)

( * ) Notice: Subject to any disclaimer, the term of this patent is extended or adjusted under 35 U.S.C. 154(b) by 0 days.

(21) Appl. No.: 15/577,069

(22) PCT Filed: Apr. 14, 2016

(86) PCT No.: PCT/CN2016/079218
§ 371 (c)(1),
(2) Date: Nov. 27, 2017

(87) PCT Pub. No.: WO2016/206447
PCT Pub. Date: Dec. 29, 2016

(65) Prior Publication Data
US 2018/0177023 A1    Jun. 21, 2018

(30) Foreign Application Priority Data
Jun. 22, 2015  (DE) .................. 10 2015 211 454

(51) Int. Cl.
*H05B 33/08* (2006.01)
*H05B 37/02* (2006.01)
*H03K 17/945* (2006.01)

(52) U.S. Cl.
CPC ........... *H05B 37/02* (2013.01); *H03K 17/945* (2013.01); *H05B 33/0815* (2013.01);
(Continued)

(58) Field of Classification Search
CPC ............. H05B 33/083; H05B 33/0815; H05B 33/0854; H05B 33/0866; H05B 33/0872;
(Continued)

(56) References Cited

U.S. PATENT DOCUMENTS 8,231,259 B2    7/2012  Keller et al.
8,519,635 B2 *  8/2013  Lin ...................... H05B 33/083
                                                                315/122
(Continued)

FOREIGN PATENT DOCUMENTS

CN    101403485    4/2009
CN    102573227    7/2012
(Continued)

OTHER PUBLICATIONS

German search report for priority application DE 10 2015 211 454.6 dated Mar. 8, 2016.
(Continued)

*Primary Examiner* — Tung X Le
*Assistant Examiner* — Borna Alaeddini
(74) *Attorney, Agent, or Firm* — Andrus Intellectual Property Law

(57) ABSTRACT

A control device comprising at least one input connector (x1, x2) configured to electrically connect an operating device (1) for driving lighting means (3a, 3b), and at least one output connector (x3, x4, x5) configured to electrically connect at least one of the lighting means (3a, 3b), a control means (4) configured to switch the lighting means (3a, 3b) based on a control signal, and a circuit (5) configured to generate voltage for supplying the control means (4) from a constant current that is generated from the operating device (1) for driving the lighting means (3a, 3b).

10 Claims, 8 Drawing Sheets

(52) U.S. Cl.
CPC ..... *H05B 33/0842* (2013.01); *H05B 33/0851* (2013.01); *H05B 37/0227* (2013.01); *H05B 37/0272* (2013.01)

(58) Field of Classification Search
CPC ............ H05B 33/0863; H05B 33/0845; H05B 33/0857; H05B 33/0809; H05B 33/0887; H05B 33/0842; H05B 33/0824; H05B 33/0827
See application file for complete search history.

(56) References Cited

U.S. PATENT DOCUMENTS

| | | | |
|---|---|---|---|
| 2007/0129814 A1 | 6/2007 | Dionne | |
| 2010/0308739 A1 | 12/2010 | Shteynberg et al. | |
| 2011/0068702 A1 | 3/2011 | van de Ven et al. | |
| 2012/0133298 A1* | 5/2012 | Campbell | H05B 37/0263 315/250 |
| 2012/0306382 A1* | 12/2012 | Maxik | F21S 2/00 315/152 |
| 2013/0082616 A1* | 4/2013 | Bradford | H05B 33/0893 315/193 |
| 2014/0152188 A1 | 6/2014 | Bora et al. | |
| 2014/0176015 A1 | 6/2014 | Suzuki | |
| 2016/0095193 A1* | 3/2016 | Mokhtari | H05B 37/0272 315/307 |
| 2016/0150604 A1* | 5/2016 | Grajcar | H05B 33/0809 315/122 |

FOREIGN PATENT DOCUMENTS

| | | |
|---|---|---|
| DE | 102009022070 | 11/2010 |
| DE | 102010005504 | 7/2011 |
| DE | 1022012205349 | 10/2013 |
| DE | 102012208267 | 12/2013 |
| KR | 20050096888 | 10/2005 |
| TW | 200945943 | 11/2009 |

OTHER PUBLICATIONS

PCT search report for parent PCT Application PCT/CN2016/079218 dated Jul. 21, 2016.

European Search Report dated Jan. 24, 2019 in co-pending European Application 16813563.

* cited by examiner

LAMP CONTROL UNIT, LIGHTING DEVICE AND LIGHTING SYSTEM

CROSS REFERENCE TO RELATED APPLICATIONS

The present application is the U.S. national stage application of International Application PCT/CN2016/079218, filed Apr. 14, 2016, which international application was published on Dec. 29, 2016 as International Publication WO 2016/206447 A1. The International Application claims priority to German Application 10 2015 211 454.6 filed Jun. 22, 2015.

FIELD OF THE INVENTION

The present invention relates to a control device, a lighting device and a lighting system. In particular, the present invention relates to a control device configured to switch or dim a lighting means that is supplied by an operating device.

BACKGROUND OF THE INVENTION

In lighting systems, often operating devices are used to drive lighting means such as gaseous-discharge lamps, halogen bulbs, light-emitting diodes (LED), with which operation of lighting means is monitored, started and/or dimmed.

Using sensors for, for example, detecting object movements, ambient brightness or absence/presence of a person and providing a respective control signal to the operating device, lighting means can automatically be switched on/off at presence/absence of a person or dimmed to automatically adapt to ambient brightness.

Sensors for operating lighting means must be supplied with a feed-in. The feed-in is usually realized from the electricity grid with an additional power supply unit for transforming alternating current in direct current (AC/DC, or an additional output of the operating device or directly from a bus system.

Such feed-in needs additional installation space in the lighting device and/or a circuit for galvanic isolation. A simple re-fitting of a sensor is only possible, when a separate output for the sensor or a compatible bus system/interface is present at the operating device.

Conventional dimming of LEDs is achieved by controlling the operating device (e.g. LED-converter), i.e., the sensor/dimmer must be connected to the operating device. In many cases the operating device is positioned at an inaccessible place, for example, on the bottom of a swimming pool while the lighting means is on the top of the swimming pool, so that it is difficult or impossible to connect and retrofit a sensor. Further, for detecting ambient brightness or detecting presence of a person, the sensor/detector should be placed near the lighting means and, when the lighting means is quite far away from the operating device, long cables or additional communication channels are necessary.

It is an object of the present invention to provide apparatuses and a system which reduce the above problems. In particular, an object of the present invention is to provide a control device, a lighting device and a lighting system, with which a simple and inexpensive retrofitting of lighting control is possible.

This object is achieved by the control device, the lighting device and the lighting system described herein.

SUMMARY OF THE INVENTION

According to the present invention, the control device comprises at least one input connector configured to electrically connect an operating device for driving lighting means, at least one output connector configured to electrically connect at least one of the lighting means, a control means configured to switch the lighting means based on a control signal and a circuit configured to generate, from a constant current that is generated by the operating device for driving the lighting means, a voltage for supplying the control means. The control signal can be an internal signal that is generated by the control means to dim up the lighting means after the operating device is switched on or to switch on/off at least a part of the lighting means at a predetermined time.

With the present invention, the control device can be directly connected to output connectors of the operating device or to the supply line, with which the lighting means is supplied with power or can be connected to the lighting means derived by the operating device. In this way, it is not necessary to provide an additional mains output or a control interface at the operating device, nor to place the control device near the operating device.

For the supply of the control device, additional feed-in and connection line outside the control device become unnecessary. Because coupling to the secondary side of the operating device, that can be a constant current converter, in case of operating with Safety Extra Low Voltage (SELV) and Safety Separation, the control device can be designed rather small.

The control device can comprise at least one pair of a first output connector and a second output connector that are configured to electrically connect one or more of the lighting means and the control means can be configured to switch the lighting means by short-circuiting the at least one pair of the first output connector and the second output connector based on the control signal, so that the current through the lighting means is stopped and the lighting means is switched off. When two or more of the lighting means are connected in series and the operating device is a constant current converter, the current flow of the remaining lighting means is kept constant by the operating device even if one of the lighting means is short-circuited. Preferably, the lighting means is an LED array.

The control device can comprise a plurality of pairs of first output connectors and second output connector and the control means of the control device can be configured to short-circuit one or more connector pairs based on the control signal. In this way, light can be dimmed by reducing or increasing the number of short-circuited connector pairs with the remaining lighting means still driven at constant current.

Alternatively or in addition, the circuit can be connected to one of the at least one input connector to electrically connect the operating device and can be connected to the at least one output connector to electrically connect the at least one of the lighting means.

Alternatively, the control device can comprise a first input connector and a second input connector that are configured to electrically connect with the operating device, wherein the circuit is connected to the first input connector and the second input connector.

Alternatively or in addition, the control means can be configured to switch the lighting means by electrically connecting the at least one input connector with the at least one output connector based on the control signal.

Alternatively or in addition, the control means can be configured to sequentially switch the lighting means based on the control signal, wherein the control means can operate with so-called pulse width modulation (PWM).

Alternatively or in addition, the control means can comprise a communication unit configured to receive and/or transmit the control signal via infrared or radio transmission.

Preferably, the control means comprises a sensor configured to generate the control signal depending on a detection. The sensor can be a presence detector, a twilight sensor or detector for detecting color temperature and/or the control signal can be a dimming signal or signal for color setting.

A lighting device according to the present invention comprises one of the above described control devices and at least one lighting means. The lighting device can comprise the operating device including a constant current converter for driving light emitting diodes or organic light-emitting diodes (OLEDs).

Preferably, a part of said lighting means is assigned to an indirect lighting and another part of said lighting means is assigned to a direct lighting and the control means is configured to switch the lighting means for the direct lighting based on the control signal.

Alternatively or in addition, a part of said lighting means can be assigned to a basic lighting and another part of said lighting means can be assigned to a main lighting, wherein the control means can be configured to switch the lighting means for the main lighting based on the control signal that indicates a presence of a person.

According to the present invention, the lighting system comprises on or more of the above described lighting devices, a control terminal configured to input a switching or dimming command by a user, to generate the control signal based on the inputted command and to transmit the control signal to the control means.

Preferably, in the lighting system, the control means of a first lighting device is configured to transmit the control signal to the control means of a second lighting device. In this way, the lighting devices may be activated at the same time.

The invention is to be explained more detailed in the following with reference to the accompanying drawings.

The same features are denoted in the figures by the same reference signs.

DETAILED DESCRIPTION

Figure 1:
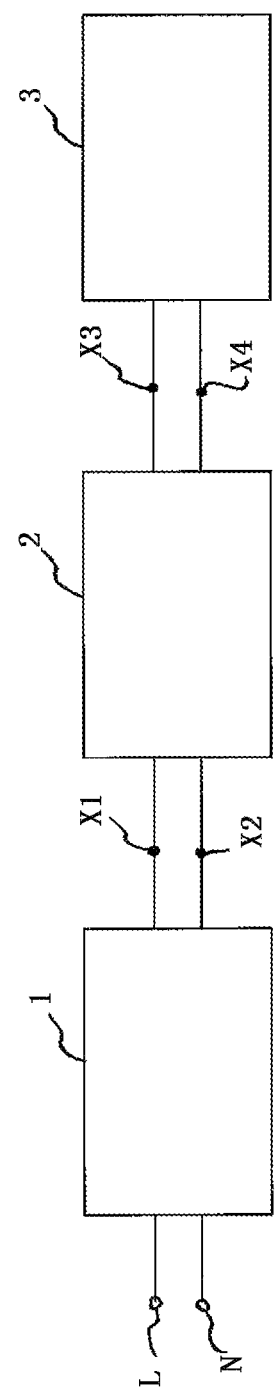
FIG. 1 shows, in schematic form, a first embodiment of a lighting device according to the present invention.

FIG. 1 shows an embodiment of a lighting device according to the present invention. The lighting device includes an operating device 1 with a mains connection L, N, a control device 2, that is connected with the output of operating device 1 via its input connectors x1, x2 and a lighting means 3 connected with the output connectors x3, x4. The operating device 1 is not an essential part of the lighting device and the lighting device can be connected to an already existing operating device 1 by means of the input connectors x1, x2.

Lighting means 3 can comprise one or more LEDs. The LEDs can be anorganic or organic LEDs. The plurality of LEDs can be arranged in parallel or in series. The plurality of LEDs can also be interconnected in more complex arrangements, for instance in several parallel-connected series circuits.

Operating device 1 can be a constant current-converter, for instance a LED-converter that generates a constant current necessary for operating the LEDs from the mains voltage. Between the mains (primary side) and the output of operating device 1 (secondary side), at which sensor 2 is connected, potential isolation and/or transformation from mains voltage into Safety Extra Low Voltage (SELV) can take place.

Figure 2:
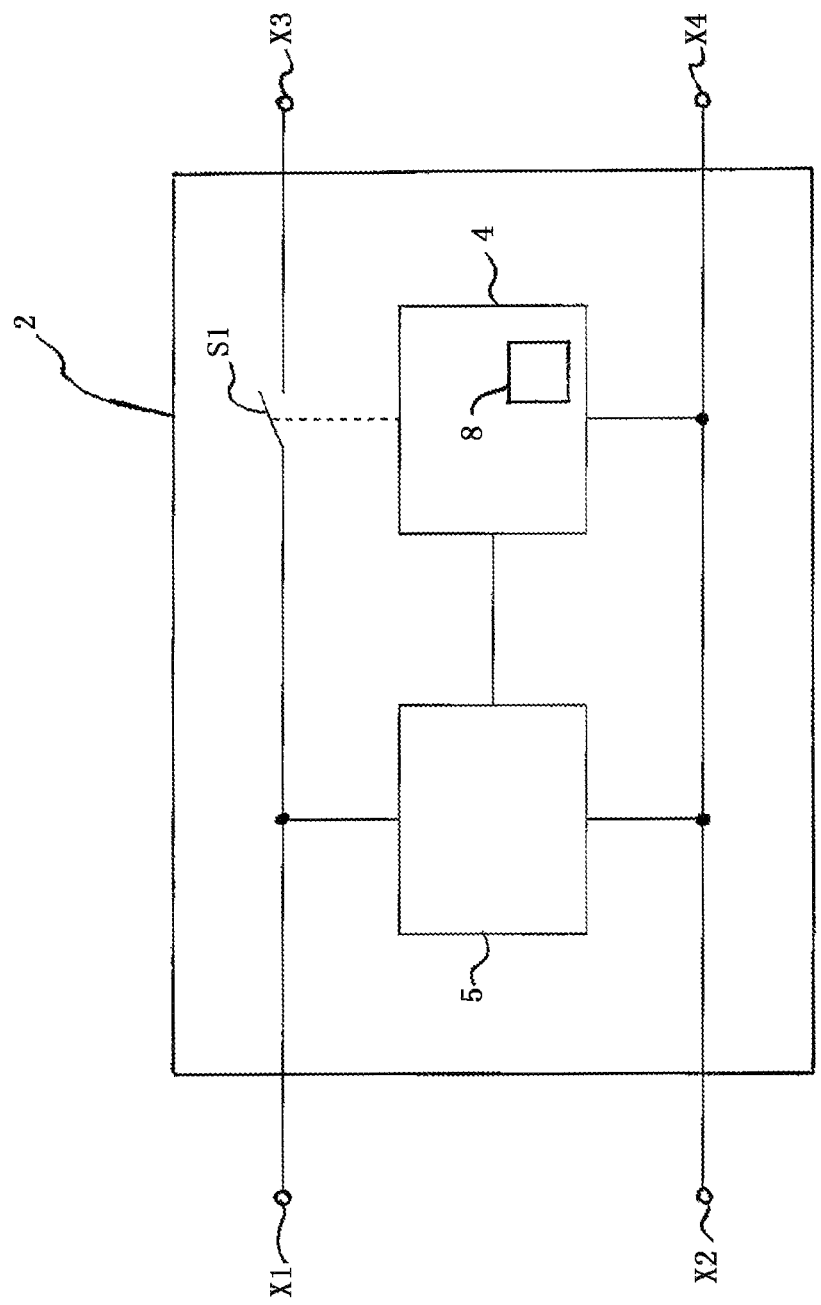
FIG. 2 shows, in schematic form, a first embodiment of a control device according to the present invention.

FIG. 2 shows details of the control device 2 shown in FIG. 1. The control device 2 comprises a control circuit 4 for controlling switch S1 as indicated by the dashed line and a circuit 5 for power supply of control device 2, in particular control circuit 4. Control circuit 4 includes one or more sensor units 8 for detecting and analyzing movement, brightness and/or noise. Alternatively, control circuit 4 can be configured to receive a control signal from a remote control or an external sensor that detects movement, brightness and/or noise and that generates the control signal (switch/dim signal) based on the detection.

In FIG. 2, circuit 5 is connected in parallel to input-connectors x1 and x2 and therefore parallel to the output of operating device 1 shown in FIG. 1. Circuit 5 generates, from the constant voltage/current provided from operating device 1 for operating lighting device 3, a suitable voltage for supply of control circuit 4 of the control device 2. For this purpose circuit 5 can comprise a DC-voltage converter, a resistor or a voltage divider.

Control circuit 4 is supplied with voltage via circuit 5 and is connected with the output of the circuit 5 and input connector x2 and output connector x4 of control device 2. Input connector x2 and output connector x4 of the control device 2 are on the same potential (e.g., ground).

Connection between the input connector x1 and the output connector x3 of the control device 2 can be separated by switch S1, which is switched dependent on the detection of detection unit 8. In the switched-on-state, the input connectors x1, x2 of the control device 2 are connected with the output connectors x3, x4 of the control device 2, so that the lighting means 3 is supplied with electric energy via the operating device 1. If switch S1 is switched off, supply of the lighting means 3 is interrupted, whereas control circuit 4 of control device 2 is still supplied via circuit 5 for the detection of, for instance, movement, brightness and/or noise. Connecting/Disconnecting can be realized clocked by means of pulse width modulation (PWM).

As can be seen from FIGS. 1 and 2, according to the present invention, control device 2 can easily be integrated in an already installed lighting system consisting of an operating device 1 and a lighting means 3 in order to provide new features such as dimming, time-delay switch or sensor function.

Figure 3:
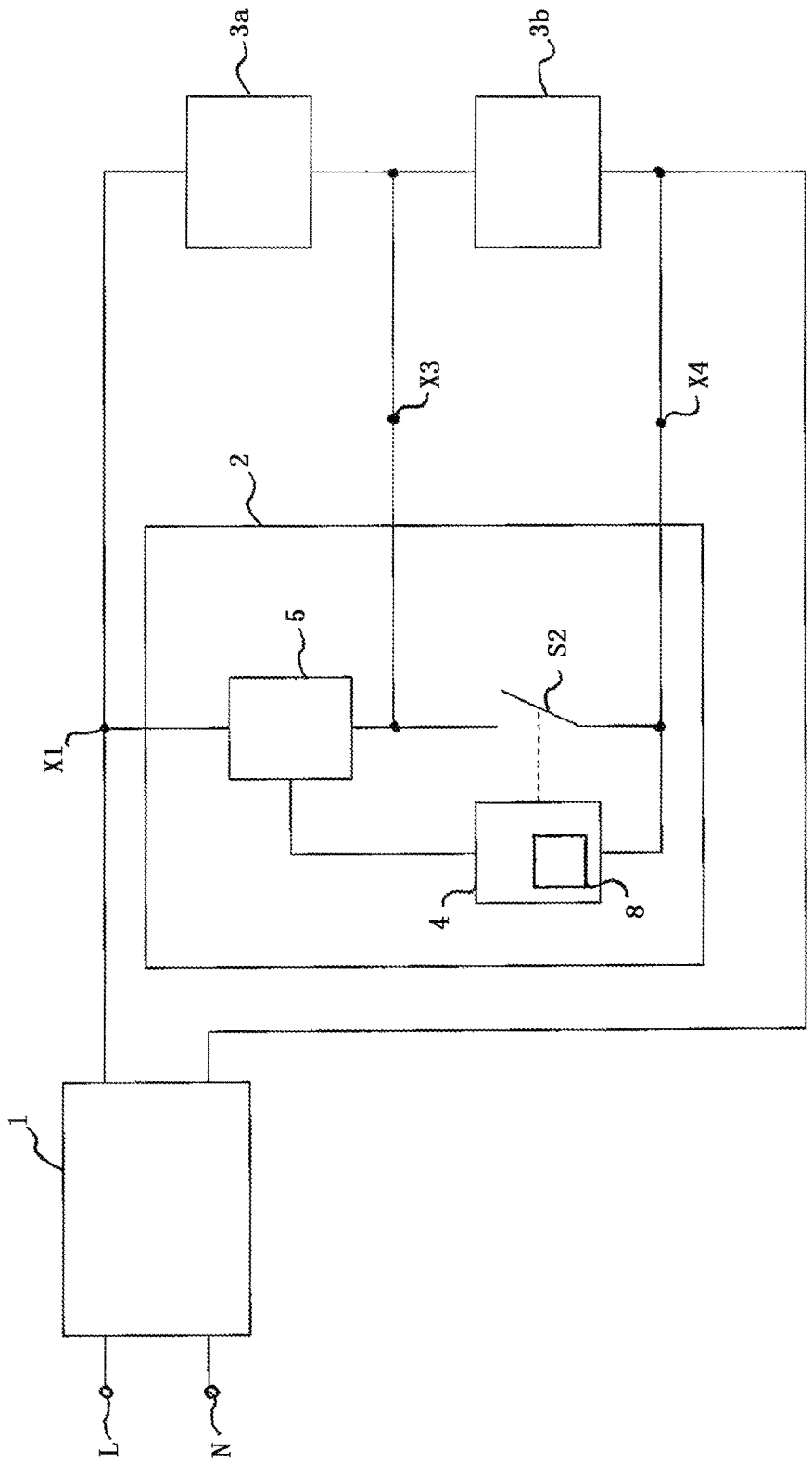
FIG. 3 shows, in schematic form, a second embodiment of the lighting device according to the present invention.

FIG. 3 shows another embodiment of a lighting device with control device 2 according to the present invention. The lighting device shown in FIG. 3 comprises two serially connected lighting means 3a and 3b (LED-blocks 3a, 3b), wherein lighting means 3b (LED-block 3b) is connected in parallel with output-connectors x3, x4 of control device 2 and a switch 2 is connected in parallel with output-connectors x3, x4. The series circuit of lighting means 3a, 3b is connected in parallel to the output of operating device 1.

Circuit 5 of the control device 2 is connected with input connector x1, output connector x3 and, when switch S2 is closed, also with output connector x4, so that a current flow for supply of circuit 5 by operating device 1 proceeds over input connector x1, the output connector x3 and lightning means 3b or input connector x1, the closed switch S2 and the lightning means 3b and output connector x4.

With switch S2, connected between output connectors x3, x4 of control device 2, lighting means 3b can be bridged or short-circuited, so that depending on a detection result of the detection unit 8 of control circuit 4, the lighting means 3b can be connected or disconnected, whereas the lightning means 3a (block 3a) is always supplied by operating device 1 with a constant current and thus is permanently illuminated.

The lighting device shown in FIG. 3 can be used for indirect and direct lighting for example, wherein block 3a is assigned to indirect/basic lighting and block 3b is assigned to direct lighting. The direct part of lighting can be switched on/off based on the control signal generated by the detecting unit 8 and the evaluation by control circuit 4 of control device 2.

Preferably, block 3a assigned to basic lighting/backlighting is switched on/off by a light switch, that switches the operating device 1 on its primary side and that is far from the lighting device, whereas block 3b is only switched on, when the presence of a person near the lighting device has been detected.

Alternatively, block 3b is switched on/off by the light switch and block 3a is switched/dimmed by the control circuit 4 depending on ambient brightness (daylight) detected by the detecting unit 8, wherein the dim-level of block 3a is continuously adjusted to the detected ambient brightness by means of pulse width modulation (PWM) or block 3a is switched off when the detected ambient brightness is higher than a threshold value.

The number of switchable lighting means 3b is not limited to one and can be increased corresponding to the capacity of operating device 1, that drives a constant current through all serially connected lighting means 3a, 3b.

Figure 4:
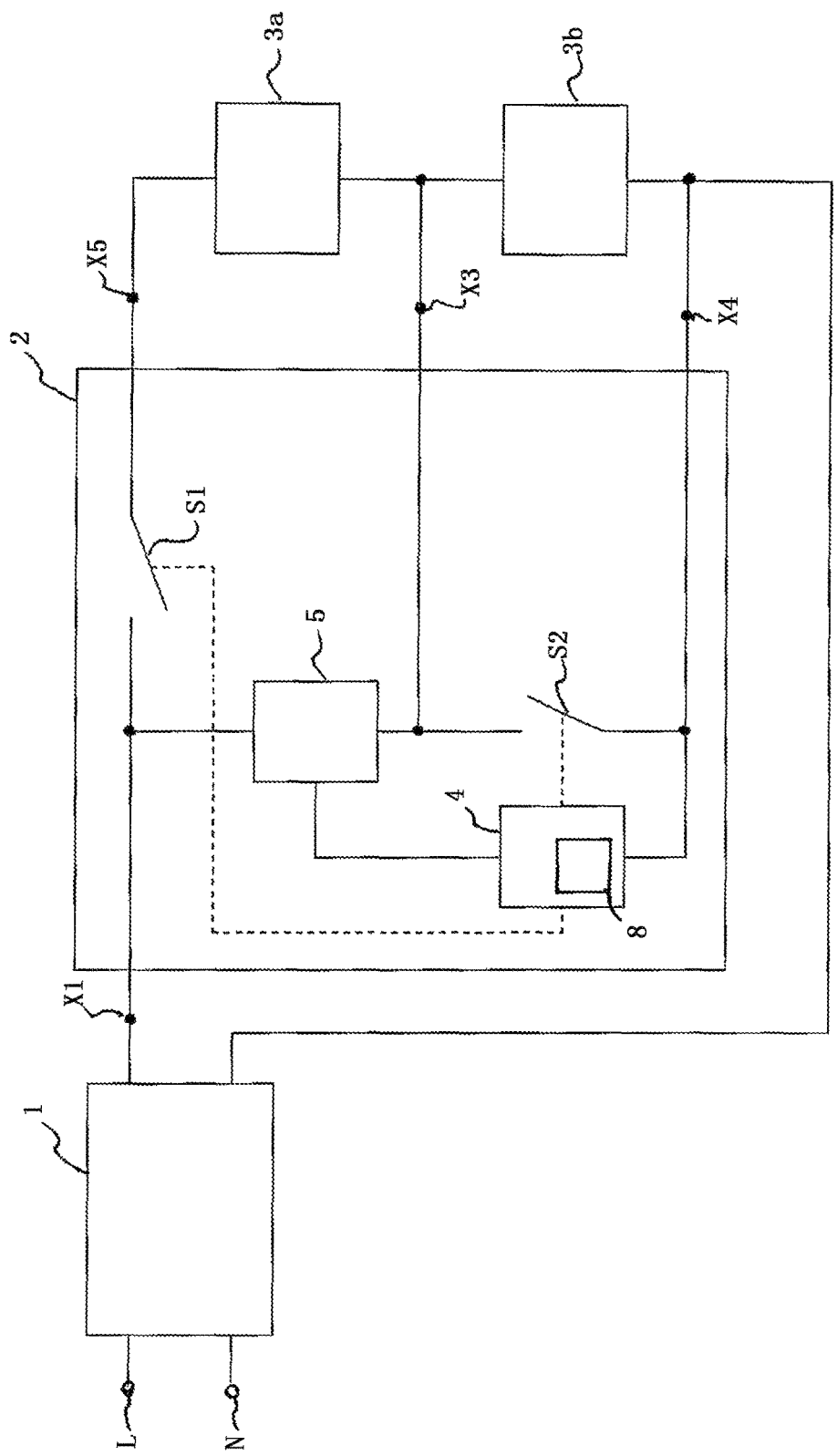
FIG. 4 shows, in schematic form, a third embodiment of the lighting device according to the present invention.

FIG. 4 shows an embodiment of the lighting device according to the present invention, where lighting means 3a is also switchable by the control device 2. In FIG. 4, lighting means 3a is serially connected with the lighting means 3b and is connected in parallel to output connector x3 and an output connector x5 of control device 2. Switch S1 connects the input connector x1 and output connector x5 of control device 2. Lighting means 3a can be switched on/off by switch S1 depending on the detection. When switch S1 is closed and lighting means 3a is switched on, lighting means 3b can be switched on/off with switch S2.

The current flow for supply of control circuit 4 of control device 2 proceeds—like in FIG. 3—from operating device 1 over input connector x1, output connector x3 and lightning means 3b or input connector x1, the closed switch S2, lightning means 3b and output connector x4.

Figure 5:
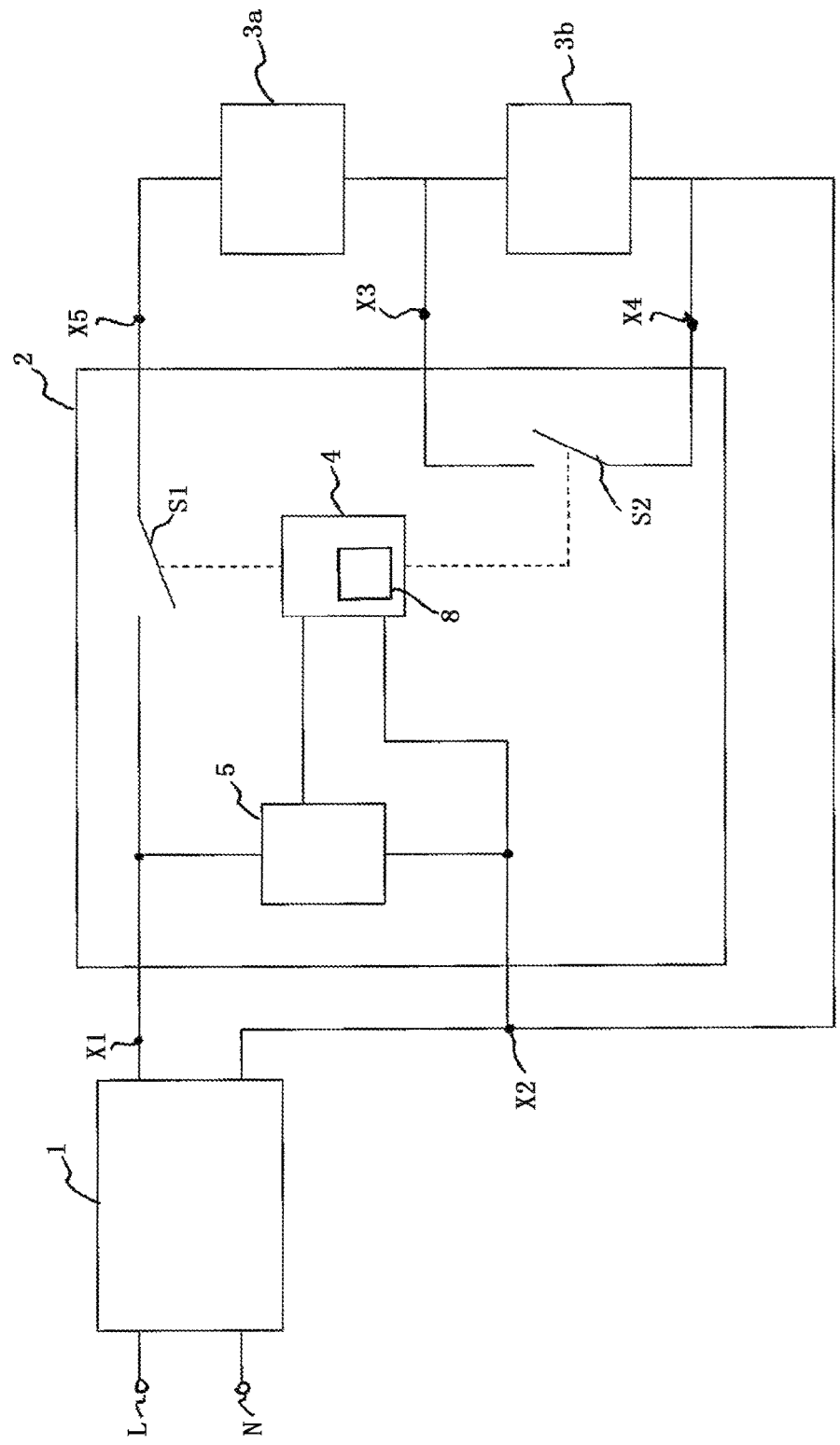
FIG. 5 shows, in schematic form, a fourth embodiment of the lighting device according to the present invention.

FIG. 5 shows another embodiment of the lighting device according to the present application, in which control device 2 is connected in parallel to input connectors x1, x2 and circuit 5 for supply of control circuit 4 is connected in parallel to input connectors x1, x2. Control circuit 4 is connected to circuit 5 and input connector x2. The arrangement of switches S1, S2 and lighting means 3a, 3b corresponds to the arrangement in FIG. 4.

Figure 6:
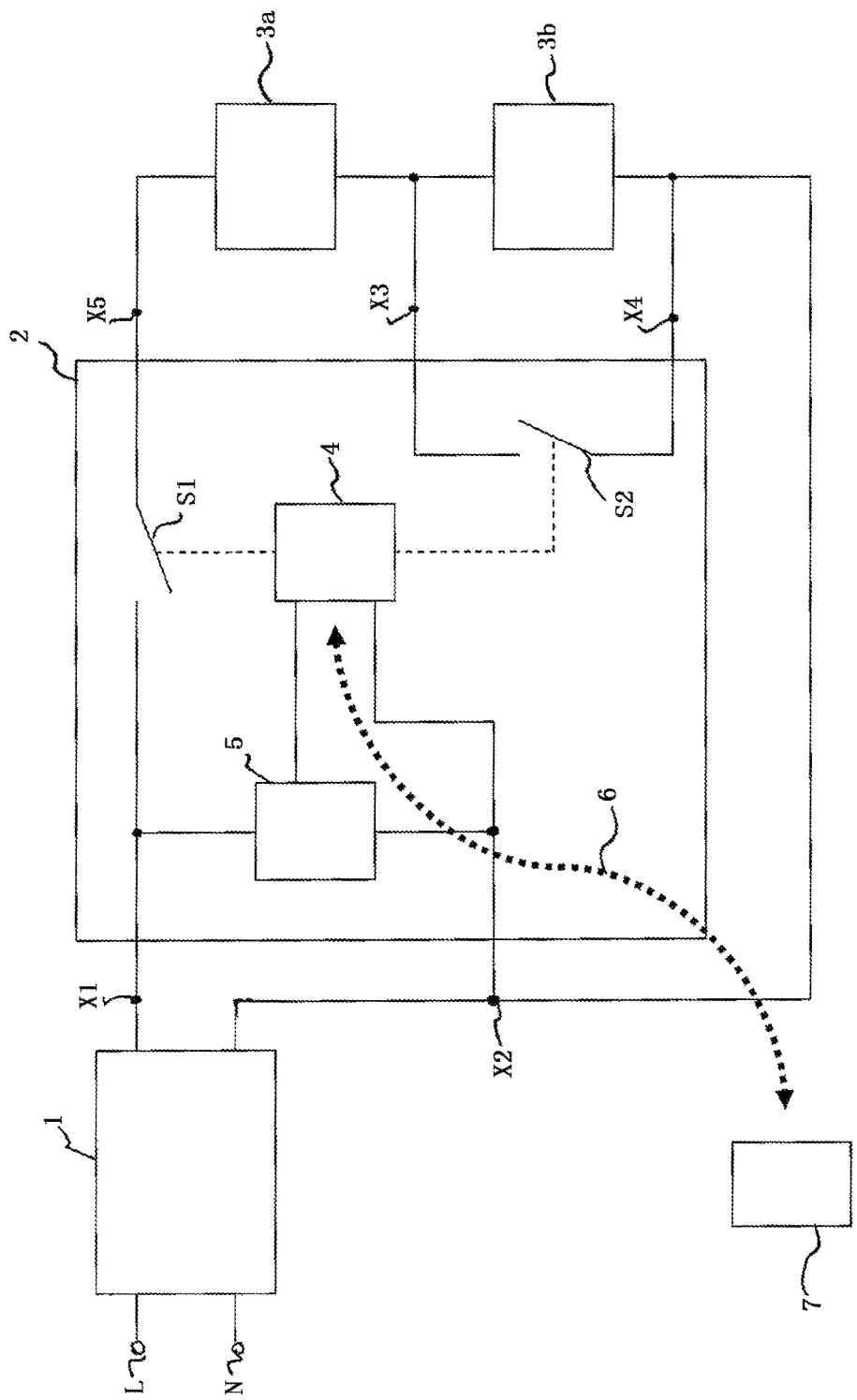
FIG. 6 shows, in schematic form, a first embodiment of the lighting system according to the present invention.

FIG. 6 shows an embodiment of the lighting system according to the present invention. The lighting system comprises the lighting device shown in FIG. 5 and a control terminal 7 for inputting a switching or dimming command by a user. Control terminal 7 generates a control signal based on an inputted command and transmits the control signal to control circuit 4, wherein control circuit controls switches S1, S2 to switch on/off or dim lighting means 3a, 3b based on the control signal.

Control circuit 4 of control device 2 has a communication unit (not shown) for receiving the control signal via infrared or radio communication 6. Control device 2 can be configured to receive a signal from control terminal 7 to adjust and/or program control circuit 4. Control terminal 7 can be configured to enter thresholds for detection, switching times and/or a duty cycle after detection, to change these values or to retrieve a signal indicating set values/settings from control circuit 4 and to display the set values/settings on a display of the control terminal 7. Control terminal 7 can be a mobile phone.

Alternatively or additionally, a communication unit for sending and/or receiving control signals to/from a control circuit 4 of another control device (not shown) by an infrared or radio connection 6 is provided. In this way, when a person is detected by the other control device, a control signal indicating such detection can be transmitted so that lighting means 3a, 3b are also switched on.

In the examples shown in FIGS. 3-6, the wire from the output connector x4 to the operating device 1 is located outside control device 2. However it is possible to place this wire or more generally speaking a connection inside operating device 1 between input connector x2 and output connector x4, to avoid additional wiring outside control device 2.

Figure 7:
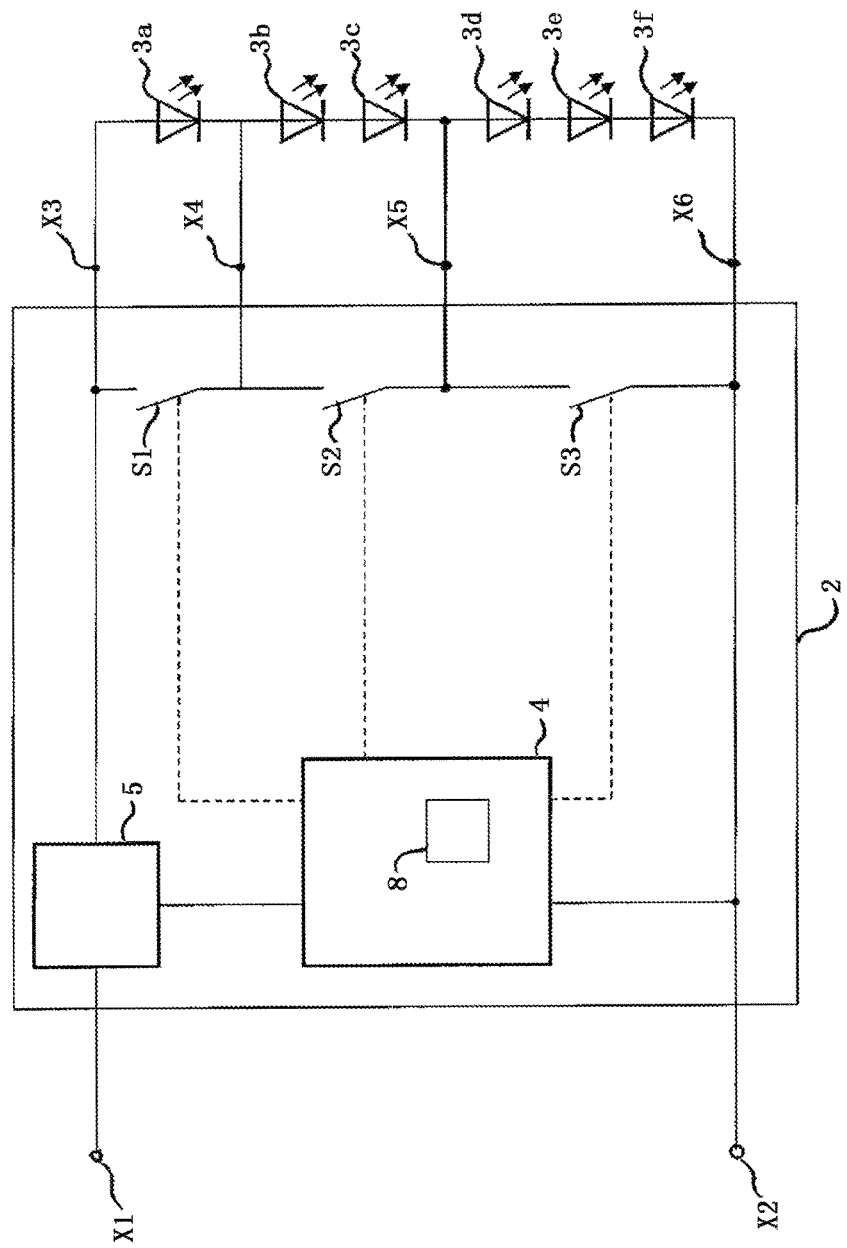
FIG. 7 shows, in schematic form, a fifth first embodiment of the lighting device according to the present invention.

As described above continuous dimming can be performed by pulse width modulation (PWM). FIG. 7 shows an embodiment of the lighting device according to the present invention, in which dimming is performed in discrete steps.

The lighting device shown in FIG. 7 comprises serially connected lighting means 3a . . . 3f, wherein lighting means 3a is connected in parallel to output connectors x3 and x4, the two serially connected lighting means 3b, 3c are connected in parallel to output connectors x4 and x5, and the three serially connected lighting means 3d, 3e, 3f are connected in parallel to output connectors x5 and x6. Switch S1 is connected in parallel to output connectors x3 and x4, switch S2 is connected in parallel to output connectors x4 and x5, and switch S3 is connected in parallel to output connectors x5 and x6.

Control circuit 4 includes detector unit 8 for detecting ambient brightness and controls switches S1 . . . S3 to select one of six dim-levels to adjust the dim-level to the detected ambient brightness, wherein for the first level, switch S1 is closed and switches S2 and S3 are open, for the second level, switch S2 is closed and switches S1 and S3 are open, for the third level, switch S3 is closed and switches S1 and S2 are open, for the fourth level, switches S1 and S3 are closed and switch S2 is open, for the fifth level, switches S2 and S3 are closed and switch S1 is open, and for the sixth level, switches S1, S2 and S3 are closed. For the case that all switches S1, S2 and S3 are closed, operating device 1 should be overload and short-circuit proof. Alternatively, the short circuit current can be limited by circuit 5 or by a resistor.

In FIG. 7, different numbers of lighting means 3a . . . 3f having identical color temperature are connected to each of output connectors x3, x4, output connectors x4, x5 and output connectors x5, x6. Alternatively or additionally, in order to provide color control, one or more lighting means 3a . . . 3f having different color temperature or color can be connected to each of output connectors x3, x4, output connectors x4, x5 and output connectors x5, x6, wherein control circuit 4 mixes/sets the color temperature or color by selectively switching lighting means 3a . . . 3f having different color temperature or colors.

Figure 8:
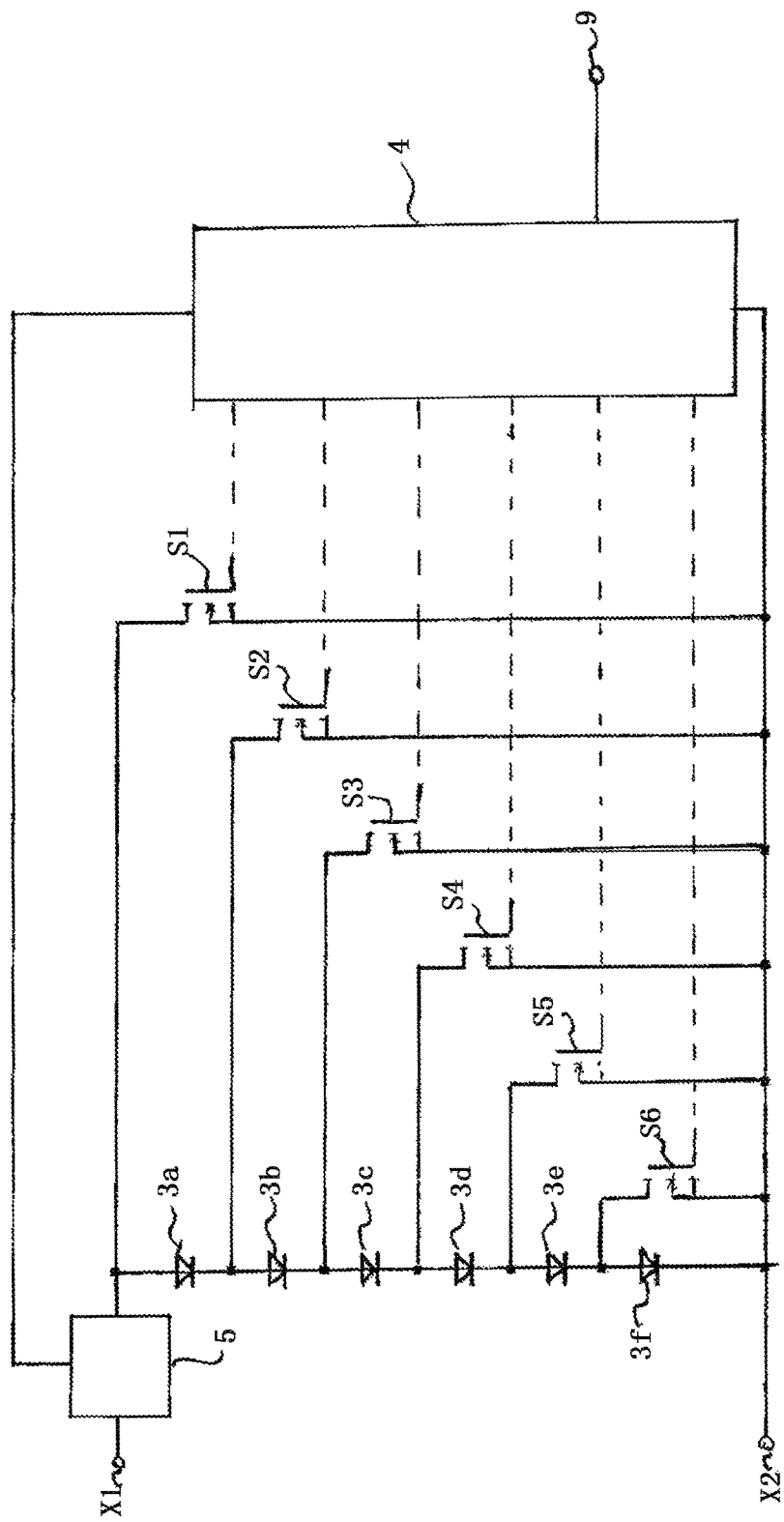
FIG. 8 shows, in schematic form, a sixth embodiment of the lighting device according to the present invention.

FIG. 8 shows an embodiment of lighting device according to the present invention, in which switches S1, S2, S3, S4, S5 and S6 are connected to lighting means 3a, 3b, 3c, 3d, 3e and 3f, respectively, wherein with switch S1, lighting means 3a . . . 3f are bypassed/short-circuited, with switch S2, lighting means 3b . . . 3f is bypassed/short-circuited, with switch S3, lighting means 3c . . . 3f are bypassed/short-circuited, with switch S4, lighting means 3d . . . 3f are bypassed/short-circuited, with switch S5, lighting means 3e . . . 3f are bypassed/short-circuited, and with switch S6, lighting means 3f is bypassed/short-circuited.

The lighting device shown in FIG. 8 comprises a terminal 9 configured to receive an external dim signal, wherein the control circuit 4 controls switches S1 . . . S6 to select one of six dim-levels based on the received dim signal, wherein lighting means 3a . . . 3f are dimmed down by successively switching-on switches S6 to S1.

In FIGS. 2 to 5, 7 and 8, lighting means 3a . . . 3f are switched/dimmed based on dim or sensor signals. Alternatively or additionally, lighting means 3a . . . 3f can be switched/dimmed based on a timer function programmed in the control circuit 4. In this way, lighting means 3a . . . 3f can be soft dimmed up after operating device is switched on and/or the color temperature of lighting means 3a . . . 3f can be changed after operating device is switched on or depending on the time of day and/or lighting means 3a . . . 3f can be dimmed in pre-programmed intervals, e.g., 50% after 3 hrs, 30% after 5 hrs, back to 100% after 10 hrs.

What is claimed is:

1. A lighting system comprising:
   light emitting diodes, wherein a first part of the lighting emitting diodes is assigned to indirect lighting and a second part of the lighting emitting diodes is assigned to direct lighting for a given area;
   an LED operating device that includes an isolated safety extra low voltage (SELV) converter and is configured to be electrically connected to mains power and to output safety extra low voltage (SELV) DC power at a constant current through a conductor to drive the light emitting diodes which are physically separated from the operating device and located remotely from the operating device;
   a sensor detecting the presence of a person in the given area for direct lighting; and
   a supplemental control device including:
   at least one input connector configured to be electrically connected to receive safety extra low voltage DC power from the conductor connected to the operating device, and connected electrically between the operating device and the light emitting diodes; at least two output connectors configured to be electrically connected to the light emitting diodes;
   wherein a first output connector of said pair is configured to be connected electrically before the second part of the lighting emitting diodes and a second output connector of said pair is configured to be connected electrically after the second part of the lighting emitting diodes;
   at least one switch disposed electrically between said pair of the output connectors in order to provide a short circuit between the pair of output connectors when the switch is closed;
   a control circuit configured to operate the switch based on a control signal from the sensor detecting the presence of a person in the given area for direct lighting; and
   a power supply circuit electrically connected to the at least one input connector and configured to generate a voltage to supply the control circuit from the constant current SELV DC power that is output by the operating device for driving the lighting emitting diodes;
   wherein the control circuit is configured to control the switch to illuminate the light emitting diodes assigned to direct lighting of the given area based on the control signal from the sensor detecting the presence of a person in the given area.

2. The lighting system of claim 1, wherein
   the control device comprises a plurality of switches and associated pairs of first output connectors and second output connectors, and
   the control device is configured to short-circuit one or more pairs of output connectors based on one or more control signals.

3. The lighting system of claim 1, wherein
   the control device comprises a first input connector and a second input connector that are configured to electrically connect the operating device, and
   the power supply circuit is connected to the first input connector and the second input connector.

4. The lighting system of claim 1, wherein
   the control circuit comprises a communication unit configured to receive and/or transmit the control signal via infrared or radio transmission.

5. The lighting system of claim 1, wherein
   the control circuit comprises an additional sensor configured to generate another control signal; wherein
   the additional sensor is one of a twilight sensor and detector for detecting color temperature.

6. The lighting system of claim 1, wherein the control circuit receives at least one additional control signal, wherein the additional control signal is one of a dimming signal and signal for color setting.

7. The lighting system of claim 1 further comprising:
   a control terminal configured to input a switching or dimming command by a user, to generate an additional control signal based on the inputted command and to transmit the control signal to the control circuit.

8. The lighting system according to claim 7 wherein the control device is a first control device, the system further comprises a second control device, and the control circuit of the first control device is configured to transmit the additional control signal to a control circuit of the second control device.

9. The lighting system according to claim 1, wherein the control circuit is configured to control the switch by pulse width modulation in order to dim the light emitting diodes assigned to direct lighting.

10. The lighting system according to claim 1 further comprising a light switch associated with the operating device, wherein the light switch associated with the operating device controls whether the indirect lighting is on or off, and the control device in response to the signal from the sensor determines whether the direct lighting is on or off when the indirect light is on.

* * * * *